(12) United States Patent
Shi et al.

(10) Patent No.: US 7,480,172 B2
(45) Date of Patent: Jan. 20, 2009

(54) PROGRAMMING SCHEME FOR SEGMENTED WORD LINE MRAM ARRAY

(75) Inventors: Xizeng Shi, Fremont, CA (US); Po-Kang Wang, San Jose, CA (US); Hsu Kai Yang, Pleasanton, CA (US)

(73) Assignees: MagIC Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 240 days.

(21) Appl. No.: 11/339,189

(22) Filed: Jan. 25, 2006

(65) Prior Publication Data

US 2007/0171702 A1    Jul. 26, 2007

(51) Int. Cl.
*G11C 11/00* (2006.01)

(52) U.S. Cl. .................. 365/158; 365/173; 365/171
(58) Field of Classification Search .............. 365/158, 365/173, 171
See application file for complete search history.

(56) References Cited

U.S. PATENT DOCUMENTS

| | | | |
|---|---|---|---|
| 6,490,217 B1 | 12/2002 | DeBrosse et al. | 365/225.5 |
| 6,584,006 B2 | 6/2003 | Viehmann | 365/97 |
| 6,816,405 B1 | 11/2004 | Lu et al. | 365/171 |
| 6,870,759 B2 | 3/2005 | Tsang | 365/158 |
| 7,206,223 B1* | 4/2007 | Nahas et al. | 365/158 |
| 2002/0176272 A1 | 11/2002 | DeBrosse et al. | 365/97 |
| 2003/0107916 A1* | 6/2003 | Ooishi | 365/171 |
| 2003/0156449 A1* | 8/2003 | Ooishi | 365/171 |
| 2004/0090856 A1* | 5/2004 | Hidaka | 365/232 |
| 2004/0130936 A1* | 7/2004 | Nguyen et al. | 365/158 |
| 2004/0165424 A1 | 8/2004 | Tsang | 365/171 |
| 2004/0190360 A1 | 9/2004 | Scheuerlein | 365/225.7 |

OTHER PUBLICATIONS

"High Speed (10-20 ns) Non-volatile MRAM with Folded Storage Elements", by Ranmuthu et al., IEEE Trans. on Magnetics, vol. 28, No. 5, Sep. 1992, pp. 2359-2361.
"Optimizing Write Current and Power Dissipation in MRAMs by Using an Astroid Curve", by Miyatake et al., IEEE Trans. on Magnetics, vol. 40, No. 3, May 2004, pp. 1723-1731.

* cited by examiner

*Primary Examiner*—Thong Q Le
(74) *Attorney, Agent, or Firm*—Saile Ackerman LLC; Stephen B. Ackerman; Billy Knowles

(57) ABSTRACT

An MRAM array has a plurality of MRAM devices that are arranged in rows and columns with segmented word lines. A magnetic biasing field is coupled to each of the MRAM devices. The MRAM devices are programmed by providing a bidirectional bit line current to a selected bit line of the plurality of bit lines and a word line current pulse to one word line segment of one row of word line segments by discharging coupled word line segments. The field biasing device may be permanent magnetic layers or write biasing lines in proximity to the fixed magnetic layer of each of the MRAM and has a magnetic orientation equivalent to the magnetic orientation of a word line segment magnetic field generated by the word line current pulse.

25 Claims, 13 Drawing Sheets

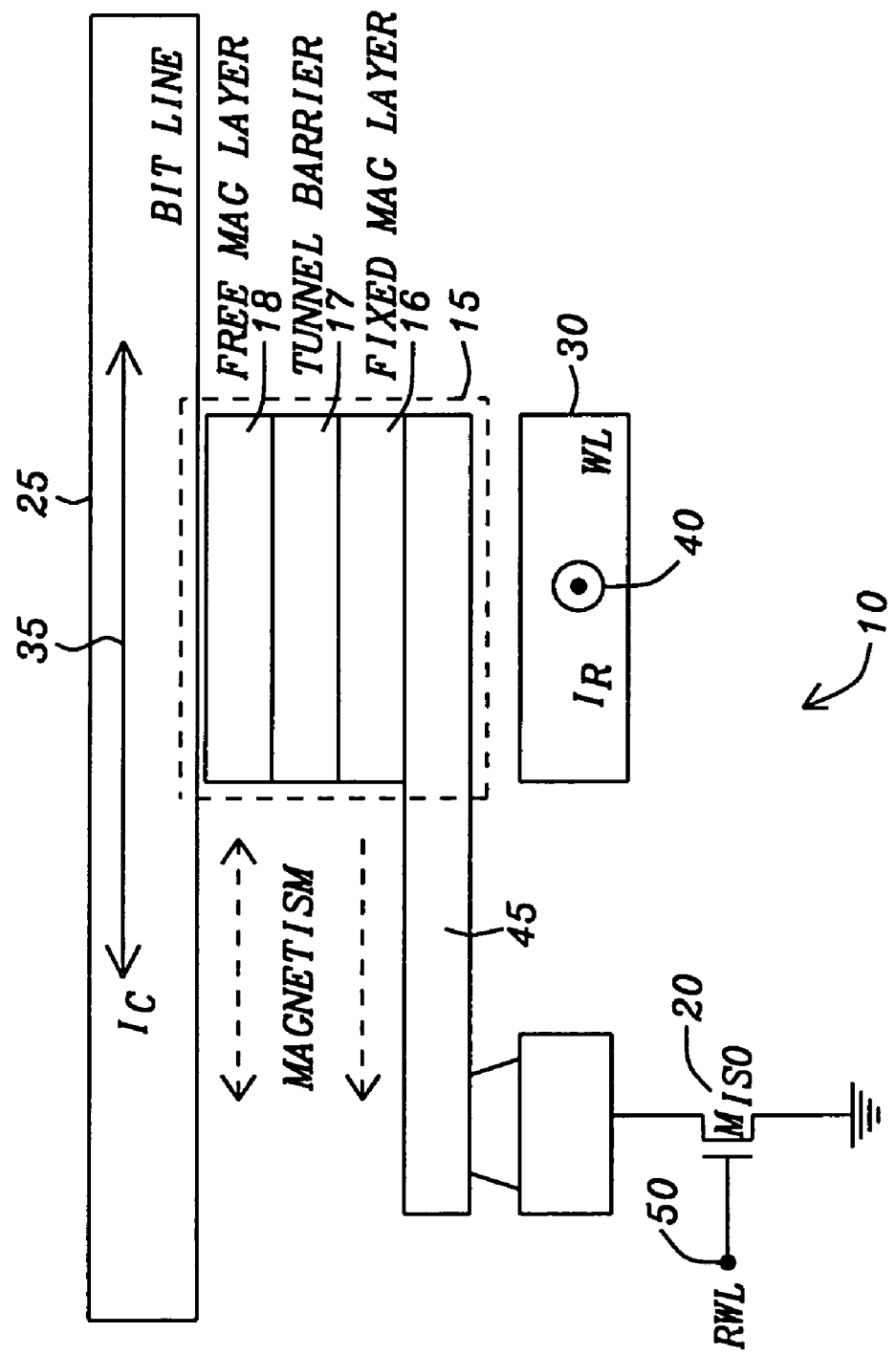
FIG. 1a – Prior Art

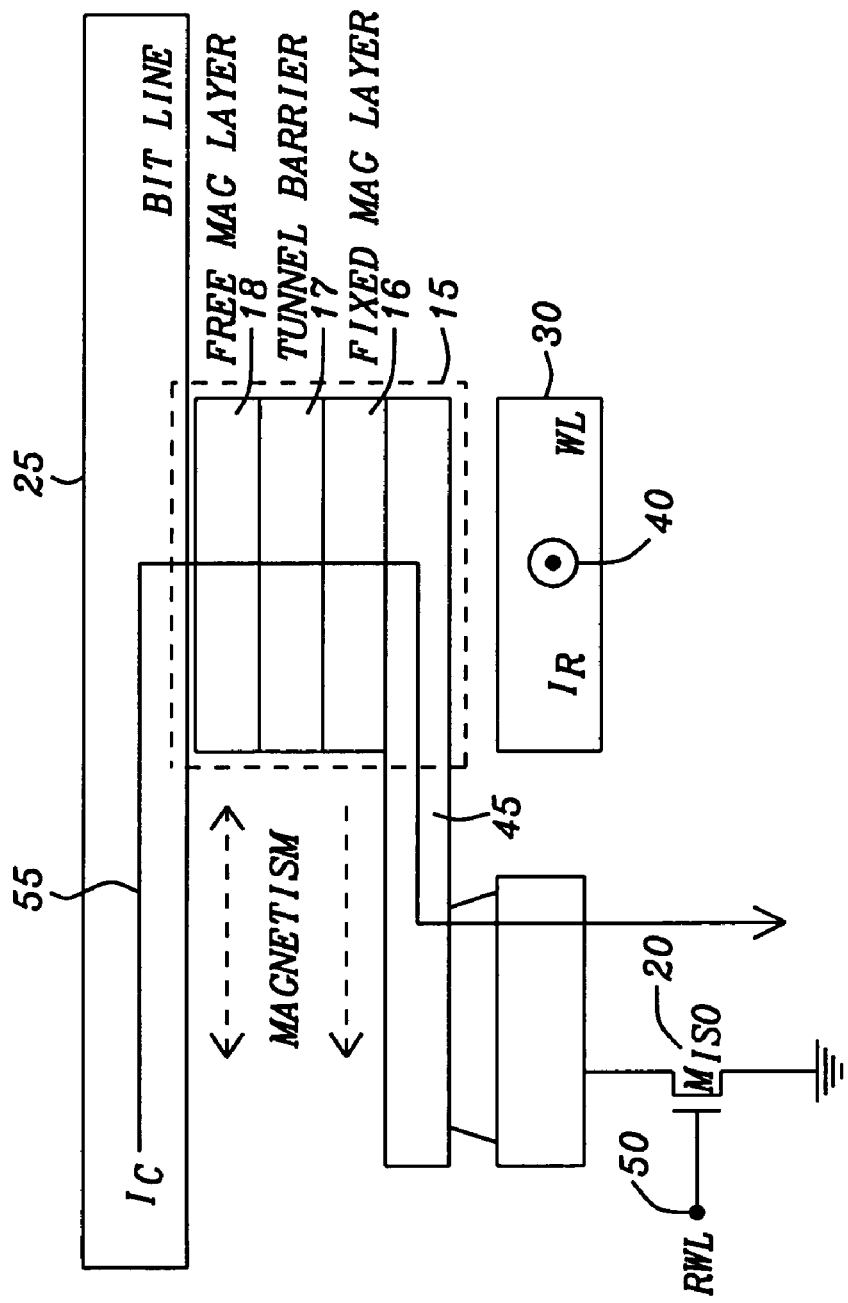
FIG. 1b – Prior Art

PROGRAMMING SCHEME FOR SEGMENTED WORD LINE MRAM ARRAY

BACKGROUND OF THE INVENTION

1. Field of the Invention

This invention relates generally to memory cells, array structures of memory cells, and methods for programming the memory cells. More particularly, this invention relates to magnetic random access memory (MRAM) cells, array structures of MRAM cells, and methods for programming MRAM cells. Even more particularly, this invention relates to programming arrays of MRAM cells having segmented word lines.

2. Description of Related Art

As shown in FIGS. 1a and 1b, a memory array is generally formed of groups of MRAM cells 10 in columns and rows. Each MRAM cell 10 has an MTJ device 15 for retaining digital data as an orientation of the magnetic fields within the MTJ device 15. Each MTJ device 10 is formed of two layers of magnetic material 16 and 18 isolated from each other by a tunnel barrier 17. The free magnetic layer 18 is adjoined to the bit line 25. The bit line 25 conducts the bidirectional cell current $I_c$ 35 such that the magnetic field developed by the bidirectional cell current $I_c$ 35 in the bit line 25 and the row write cell current $I_R$ 40 in the row write line conductor 30 determine the magnetic orientation of the free magnetic layer 18. The direction of the bidirectional cell current $I_c$ 35 determines the state of digital data within the MTJ device 15. The word line 30 conducts a row write cell current $I_R$ 40 in one direction. The magnetic orientation of the fixed magnetic layer 16 is determined during manufacturing of the MTJ device 15.

The fixed magnetic layer 16 is adjoined to a conductor 45 that is connected to the drain of an isolation transistor $M_{ISO}$ 20. The source of the isolation transistor $M_{ISO}$ 20 is connected to the ground reference point. The gate of the isolation transistor $M_{ISO}$ 20 is connected to a read word line RWL In the write operation of the MRAM cell 10, the direction of conduction of the bidirectional cell current $I_c$ 35 determines the magnetic orientation of the free magnetic layer 18 and thus the digital data state retained by the MRAM cell 10. During the write process, the read word line RWL 50 deactivates the isolation transistor $M_{ISO}$ 20 to prevent current conduction.

The read operation is illustrated in FIG. 1b. The read word line RWL 50 is set to a state to activate or turn on the isolation transistor $M_{ISO}$ 20. The cell current $I_c$ 55 is passed through the bit line 25, through the MTJ device 15, and the isolation transistor $M_{ISO}$ 20 to the ground reference point. The magnetic orientation of the free magnetic layer 18 as compared to the magnetic orientation of the fixed magnetic layer 16 determine the resistance of the MTJ device 15. FIG. 2 shows the schematic diagram of the MRAM cell 10 with the MTJ device 15 and the isolation transistor $M_{ISO}$ 20 serially connected. The read word line RWL 50 controls the activation and deactivation of the isolation transistor $M_{ISO}$ 20. The bit line 25 is adjoined to the free magnetic layer 18 for reading the MRAM cell 10.

An MRAM array 100 of the prior art is illustrated in FIG. 3. The MRAM cells 105 are organized in rows and columns to form the MRAM array 100. Each MRAM memory cell 105 is structured and functions as described in FIGS. 1a and 1b. Each column of the MRAM memory cells 105 has a bit line 106a, 106b, ..., 106n-1, 106n, 107a, 107b, ..., 107n-1, 107n placed such that the bit line 106a, 106b, ..., 106n-1, 106n, 107a, 107b, ..., 107n-1, 107n is magnetically coupled to the free magnetic layer of each of the MRAM memory cells 105. Each bit line 106a, 106b, ..., 106n-1, 106n, 107a, 107b, ..., 107n-1, 107n is connected to a current source to receive the bidirectional cell current $I_c$.

Similarly, each row of the MRAM memory cells 105 has a segmented word line. As illustrated, a group of the MRAM cells are collected into separate blocks 110a and 110b. The rows of the MRAM cell block 110a have the word line segments 108a, 108b, ..., 108m-1, 108m and the rows of the MRAM cell block 110b have the word line segments 109a, 109b, ..., 109m-1, 109m. The word line segments 109a, 109b, ..., 109n-1, 109n are placed such that each of the word line segments 108a, 108b, ..., 108m-1, 108m and 109a, 109b, ..., 109m-1, 109m is magnetically coupled to the free magnetic layer of each of the MRAM cells 105 on its associated row of MRAM cells.

One end of all of the word line segments 108a, 108b, ..., 108m-1, 108m are connected to the source of the Block Select transistor 135a to select the MRAM cell block 110a. Each of the opposing ends of the word line segments 108a, 108b, ..., 108m-1, 108m is connected to a drain of a Row Write Select transistor 120a, 120b, ..., 120m-1, 120m. The drain of the Block Select transistor 135a is connected to the Word Line Current Source 145. The gate of the Block Select transistor 135a is connected to the Block Select Line 140a. The sources of each of the Row Write Select transistors 120a, 120b, ..., 120m-1, 120m are connected to the current return line 150. Each of the gates of the Row Write Select transistors 120a, 120b, ..., 120m-1, 120m is connected to a Row Write Select Line 115a, 115b, ..., 115m-1, 115m. The Block Select Line 140a controls the activation and deactivation of the Block Select transistor 135a to control the flow of the Row Write Current $I_R$ from the current source 145 through a selected row segment of the MRAM memory cells 105 and a selected Row Write Select transistors 120a, 120b, ..., 120m-1, 120m to the reference current return line 150. The Row Write Select Lines 115a, 115b, ..., 115m-1, 115m control the activation and deactivation of the Row Write Select transistors 120a, 120b, ..., 120m-1, 120m to steer the Row Write current from the Word Line Current source 145 through the selected word line segment 108a, 108b, ..., 108m-1, 108m.

One end of all of the word line segments 109a, 109b, ..., 109m-1, 109m are connected to the source of the Block Select transistor 135b to select the MRAM cell block 110b. Each of the opposing ends of the word line segments 109a, 109b, ..., 109m-1, 109m is connected to a drain of a Row Write Select transistor 125a, 125b, ..., 125m-1, 125m. The drain of the Block Select transistor 135b is connected to the Word Line Current Source 145. The gate of the Block Select transistor 135b is connected to the Block Select Line 140b. The sources of each of the Row Write Select transistors 125a, 125b, ..., 125m-1, 125m are connected to the current return line 150. Each of the gates of the Row Write Select transistors 125a, 125b, ..., 125m-1, 125m is connected to a Row Write Select Line 115a, 115b, ..., 115m-1, 115m. The Block Select Line 140b controls the activation and deactivation of the Block Select transistor 135b to control the flow of the Row Write Current $I_R$ from the current source 145 through a selected row segment of the MRAM memory cells 105 and a selected Row Write Select transistors 125a, 125b, ..., 125m-1, 125m to the current return line 150. The Row Write Select Lines 115a, 115b, ..., 115m-1, 115m control the activation and deactivation of the Row Write Select transistors 125a, 125b, 125m-1, 125m to steer the Row Write current from the Word Line Current Source 145 through the selected word line segment 109a, 109b, ..., 109m-1, 109m.

Each row of the MRAM memory cells 105 has a Read Word Line 130a, 130b, . . . , 130m-1, 130m connected to the gate of the isolation transistor of each of the MRAM memory cells 105. The Read Word Lines 130a, 130b, . . . , 130m-1, 130m control the activation and deactivation of the isolation transistors of each of the MRAM memory cells 105 with the selected row of the MRAM array 100 being activated during a read operation to conduct the read current from the associated bit line 106a, 106b, . . . , 106n-1, 106n, 107a, 107b, . . . , 107n-1, 107n through the MTJ device of the selected MRAM memory cells 105.

Writing one MRAM cell 105 or all the MRAM cells of a row segment of a block 110a or 110b of the MRAM memory cells 105 is shown in the plot of FIG. 4. The Block Select Line 140a or 140b is activated to turn on the selected Block Select transistor 135a or 135b for the chosen MRAM cell block 110a or 110b. The Row Write Select Line 115a, 115b, . . . , 115m-1, 115m for the selected row segment of the MRAM cell block 110a or 110b is activated to turn on the Row Write Select transistors 120a, 120b, . . . , 120m-1, 120m and 125a, 125b, 125m-1, 125m to steer the Row Write current $I_R$ through the selected word line segment 108a, 108b, . . . , 108m-1, 108m or 109a, 109b, . . . , 109m-1, 109m at the time $\tau_1$. The bidirectional cell current $I_c$ is applied at the time $\tau_2$ to the selected block of MRAM cells through the appropriate bit lines 106a, 106b, . . . , 106n-1, 106n, 107a, 107b, . . . , 107n-1, 107n. At the time $\tau_3$, the Block Select Line 140a or 140b is deactivated to turn off the selected Block Select transistor 135a or 135b for the chosen MRAM cell block 110a or 110b and the programming of the selected row segment of the selected MRAM cell block 110a or 110b is completed by the termination of the positive or negative bidirectional cell current $+I_C$ or $-I_C$ at the time $\tau_4$.

The bidirectional cell current $I_c$ is either a positive $+I_C$ or negative $-I_C$ current dependent on the state of the digital data to be programmed to the selected MRAM cells 105.

"High Speed (10-20 ns) Non-Volatile MRAM with Folded Storage Elements," Ranmuthu, et al., IEEE Transactions on Magnetics, Sep. 1992, Vol. 28, Issue 5, pp. 2359-2361 describes an MRAM chip has been designed using 250 Ω folded memory cells, two-turn word lines, and a high-speed differential sensing scheme.

"Optimizing Write Current and Power Dissipation in MRAMs By Using an Asteroid Curve," Miyatake, et al., IEEE Transactions on Magnetics, May 2004, Vol. 40, Issue 3, pp. 1723-1731 describes the analytical expressions of minimum electric current and power dissipation, and bit line and word line currents that produce them, for writing data into magnetic tunnel junction (MTJ) magneto resistive random access memory (MRAM) cells are derived with the assumption that an asteroid curve can be applied to all MTJs in a memory cell array. The expressions contain word length, that is, the number of bits per word, and parasitic resistances of the write word line and bit line (which are important design parameters of memory cell arrays) and distances between the write currents and the free magnetic layer for data storage (which are important structural parameters of MTJ cells). They provide quantitative MRAM design guidelines and help to understand current and power behavior.

U.S. Pat. No. 6,490,217 (DeBrosse, et al.) teaches an MRAM memory device that has a multiple segmented groups. Each segmented group includes a number of memory cells operatively coupled to a corresponding segmented word line. Each segmented word line is disposed in relation to the plurality of corresponding memory cells such that the destabilizing current passing through the segmented word line destabilizes the corresponding memory cells for writing.

U.S. Pat. No. 6,584,006 (Viehmann) provides a segmented MRAM bit line and word line architecture. Switch circuits are coupled to and located along the adjacent bit lines resulting in the array being divided into segments along the adjacent bit lines. The segmenting of the bit lines and word lines shortened the programming current path that results in decreased resistance across the device.

U.S. Pat. No. 6,816,405 (Lu, et al.) describes a segmented word line architecture for cross point MRAM arrays. The MRAM array magnetic memory cells is arranged in rows coupled to local word lines for assisting in writing a logical state of the at least one memory cell. The MRAM array further has global word lines connected to at least one of the plurality of local word lines. The global word lines are substantially isolated from the memory cells. Write circuits are operatively coupled to the global word lines. The write circuits are configurable as a current source and/or a current sink for supplying and/or returning, respectively, at least a portion of a write current for assisting in writing one or more memory cells. The write circuits are configured to selectively distribute the write current across at least a plurality of global word lines so that stray magnetic field interaction between selected memory cells and half-selected and/or unselected memory cells is reduced.

U.S. Pat. No. 6,870,759 (Tsang) and United States Patent Application 2004/0165424 (Tsang) illustrate an MRAM array with segmented magnetic word lines. Each of the segment word line is coupled with the global word line(s) such that each segment is separately selectable. Each segment is coupled to a portion of the magnetic storage cells.

United States Patent Application 2004/0190360 (Scheuerlein) describes a word line arrangement having multi-layer word line segments for three-dimensional memory array. The three-dimensional (3D) passive element memory cell array provides short word lines while still maintaining a small support circuit area for efficiency. Short, low resistance word line segments on two or more word line layers are connected together in parallel to form a given word line without use of segment switch devices between the word line segments. A shared vertical connection preferably connects the word line segments together and connects to a word line driver circuit disposed generally below the array near the word line. Each word line driver circuit preferably couples its word line either to an associated one of a plurality of selected bias lines or to an unselected bias line associated with the driver circuit, which selected bias lines are themselves decoded to provide for an efficient multi-headed word line decoder.

SUMMARY OF THE INVENTION

An object of this invention is to provide an MRAM array where selected MRAM cells are programmed with a current pulse provided by discharging a capacitance resulting from charge present on connected word line segments.

Another object of this invention is to provide an MRAM array where a biasing magnetic field is provided by permanent magnetic layers is placed in proximity to each MRAM cell of the MRAM array to allow small programming currents to be applied to the selected MRAM cells.

Further, another object of this invention is to provide an MRAM array where a biasing magnetic field is provided by a write biasing lines placed in proximity to each MRAM cell of the MRAM array to allow small programming currents to be applied to the selected MRAM cells.

To accomplish at least one of these objects, an MRAM array has a plurality of MRAM devices arranged in rows and columns. A plurality of bit lines are placed such that each bit line is associated with one column of the columns of the plurality of MRAM devices and is adjoined to a free magnetic layer of each MRAM device of the column. A plurality of word lines is placed such that each word line is associated with one row of the plurality of MRAM devices. Further each of the word lines is divided into multiple word line segments. A field biasing device is placed to have a magnetic coupling to each of the plurality of MRAM devices to provide a magnetic biasing field to each of the MRAM devices. The magnetic biasing field has a magnetic orientation equivalent to the magnetic orientation of a word line segment magnetic field generated by the word line current pulse.

An MRAM programming circuit is in communication with each of the plurality of bit lines and each of the multiple word line segments of the plurality of word line. The programming circuit provides a bidirectional bit line current to a selected bit line of the plurality of bit lines and a word line current pulse to one word line segment of one row of word line segments. The bidirectional bit line current is activated at a first time, the word line current pulse is activated to have a duration from a second time to a third time, and the bidirectional bit line current is deactivated at a fourth time.

The MRAM programming circuit includes block select transistors connected to each of the word line segments for charging the word line segments to provide the necessary charge for the word line current pulse. A plurality of word line segment transistors are coupled between each of the multiple word line segments of the plurality of word lines and a word line current return path. When one of the word line segment transistors is turned on the word line current pulse passed through the word line segment transistor to the word line current return path. The word line current pulse is generated by discharging groupings of the word line segments coupled together to the MRAM programming circuit.

The field biasing device, in one embodiment, includes a plurality of permanent magnetic layers, each of the permanent magnetic layers is placed in proximity to the MRAM devices to provide the magnetic biasing field. In a second embodiment, the field biasing device is formed of a plurality of write biasing lines. Each write biasing line is in close proximity to each MRAM device of one row of the MRAM devices, essentially parallel to the word line segments of the word line associated with the row of MRAM devices.

BRIEF DESCRIPTION OF THE DRAWINGS

FIGS. 1a and 1b are cross sectional diagrams of an MRAM cell of the prior art.

DETAILED DESCRIPTION OF THE INVENTION

Figure 2:
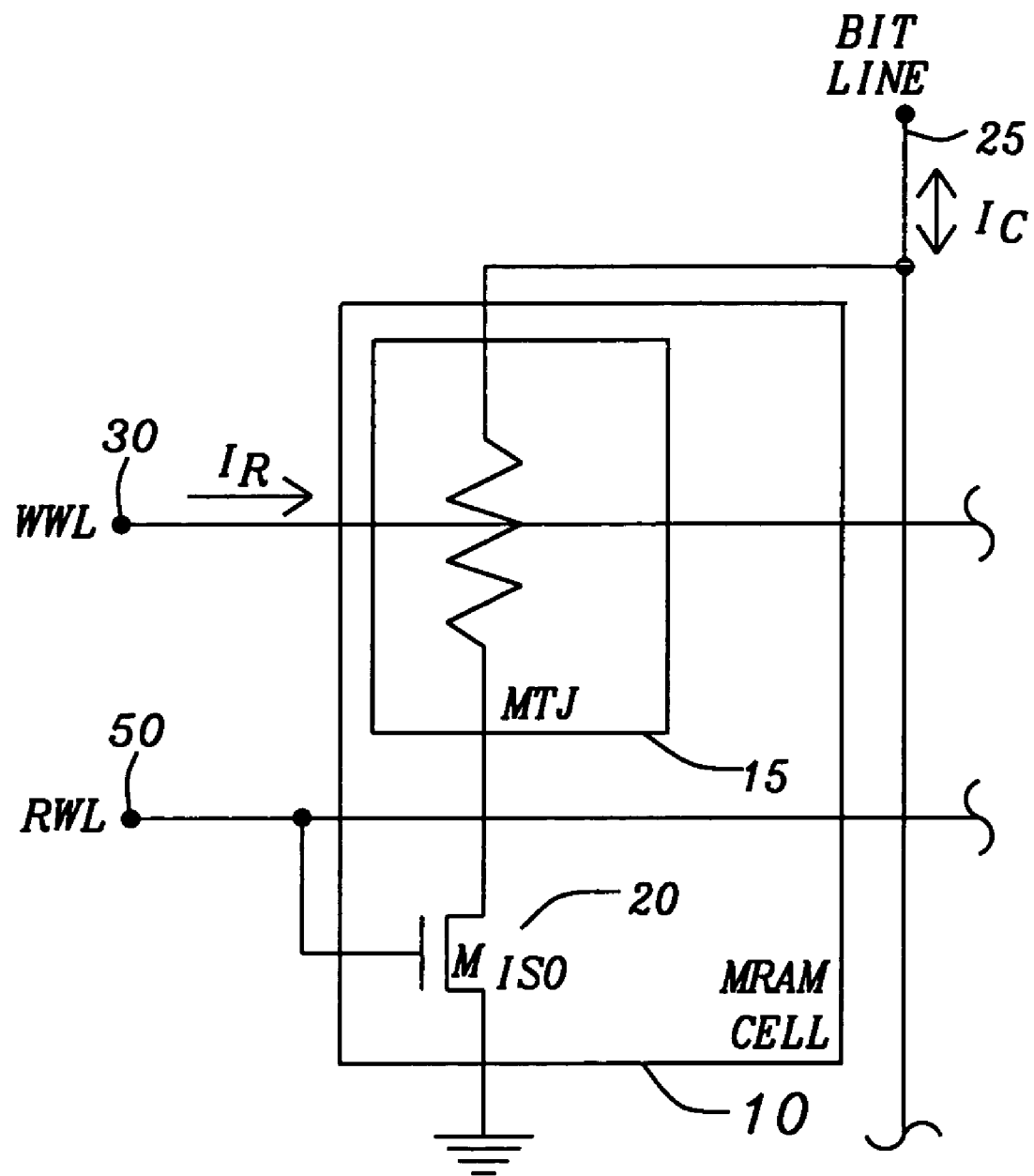
FIG. 2 is a schematic diagram of an MRAM cell of the prior art.
Figure 3:
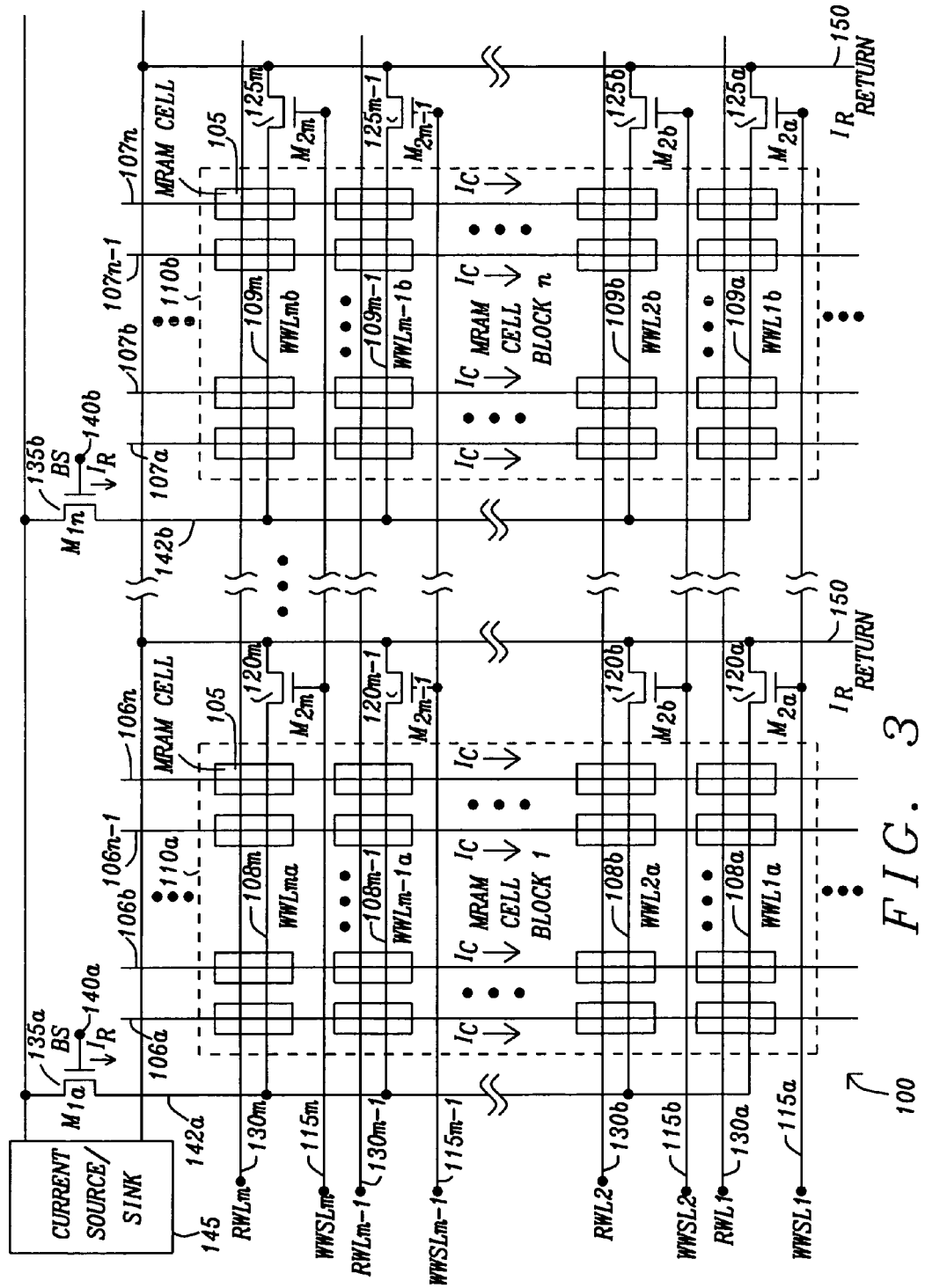
FIG. 3 is a block diagram of an MRAM array.
Figure 4:
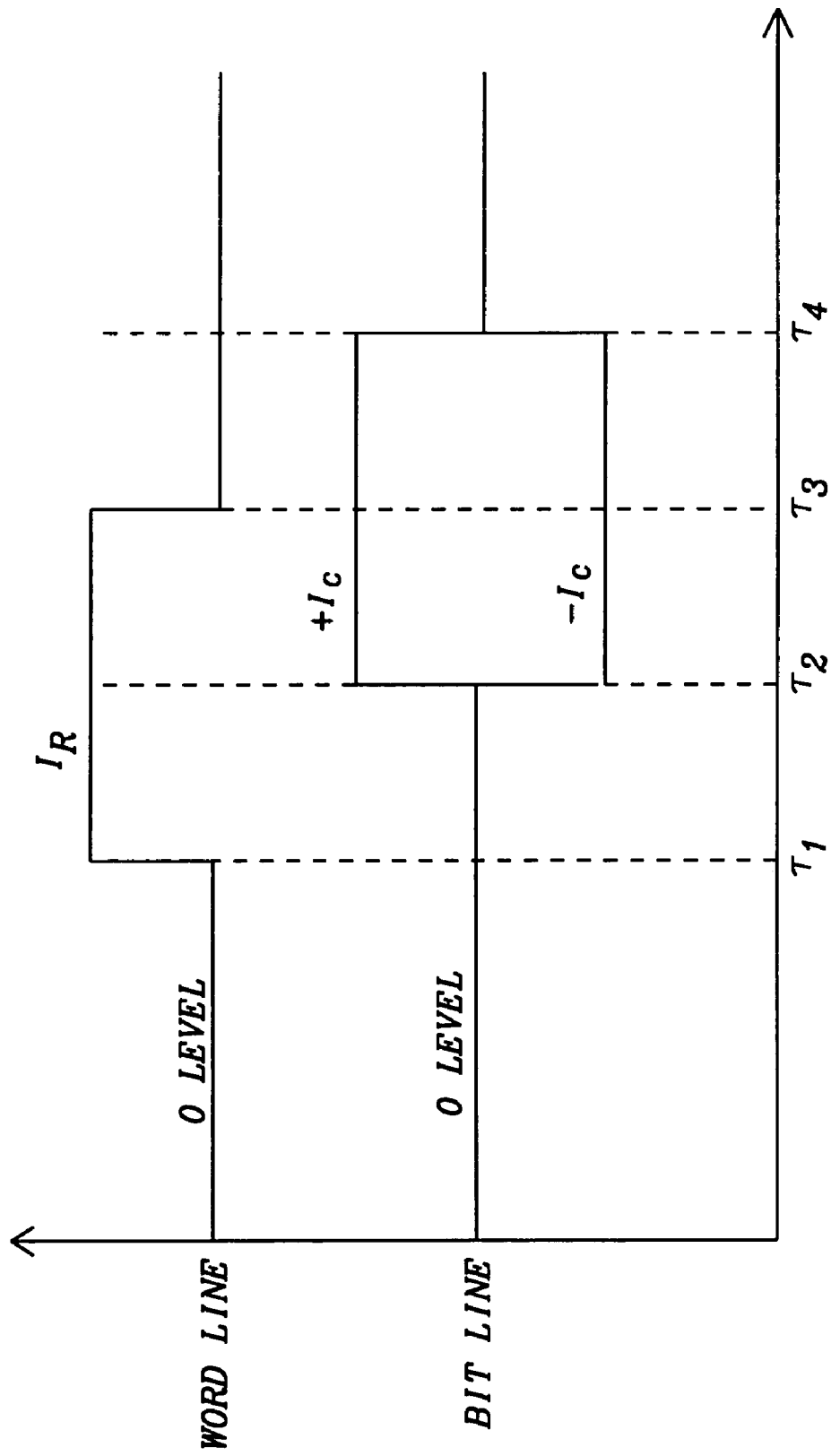
FIG. 4 is a plot of the bidirectional cell current and word line segment row write current of the prior art.
Figure 5:
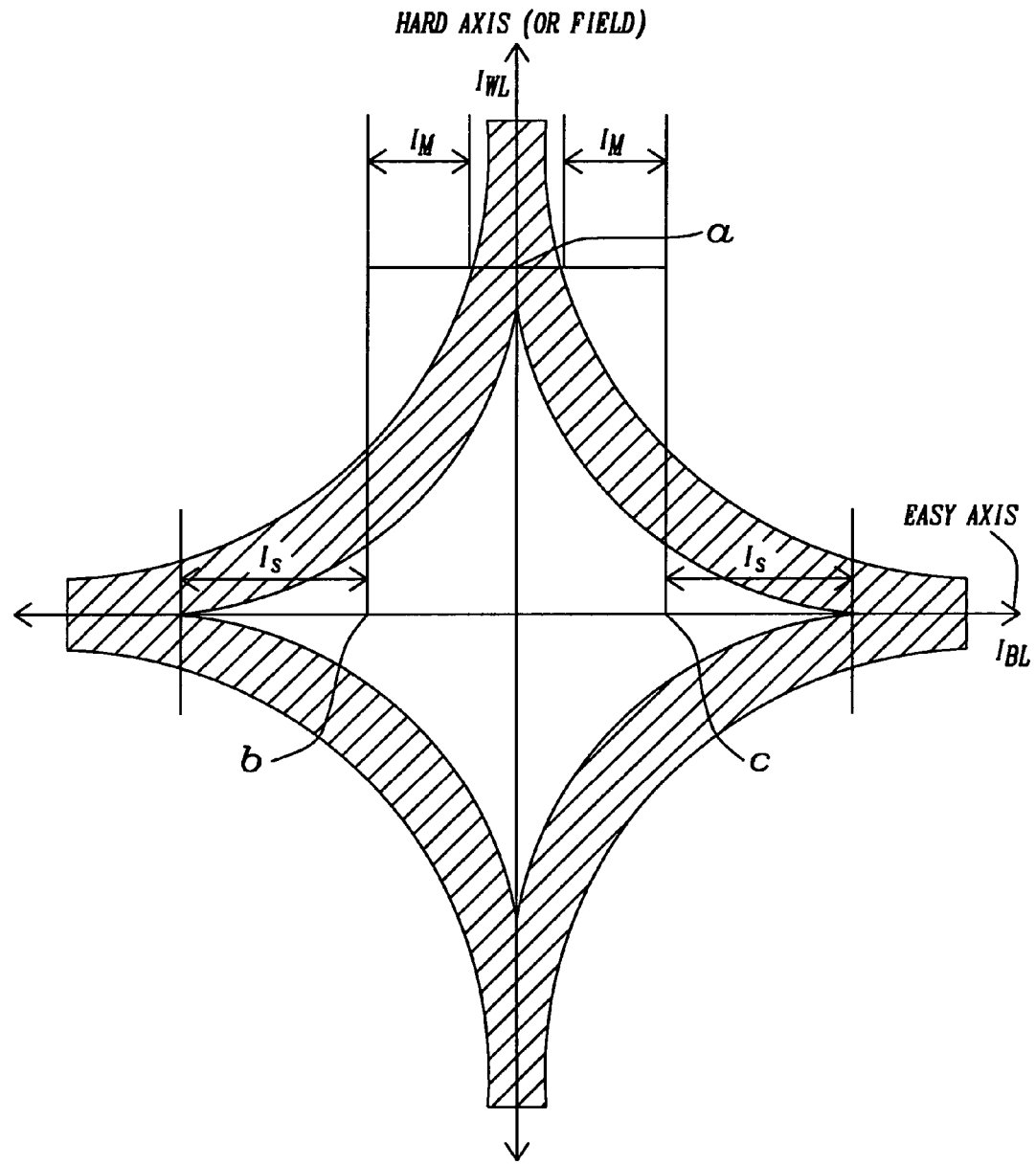
FIG. 5 is an asteroid chart for programming MRAM cells in an array of this invention.

As shown in FIG. 3, the word line programming current or row write cell current $I_R$ 40 is transferred through the selected word line segment 108a, 108b, . . . , 108m-1, 108m or 109a, 109b, . . . , 109m-1, 109m. Any MTJ devices of the MRAM cells 105 not on the selected word line segment 108a, 108b, . . . , 108m-1, 108m or 109a, 109b, . . . , 109m-1, 109m are not affected by the programming current. Referring to FIG. 5, the asteroid chart illustrates the composite characteristics of MTJ devices of an MRAM cell array 100. It can be shown that the selected word line segment 108a, 108b, . . . , 108m-1, 108m or 109a, 109b, . . . , 109m-1, 109m can be biased into the shaded region at point a such that the positive and negative bidirectional cell currents $+I_C$ and $-I_C$ of the appropriate bit lines 106a, 106b, . . . , 106n-1, 106n, 107a, 107b, . . . , 107n-1, 107n having the selected MRAM cell 105 have a current greater than the current $I_M$ at the points b and c. The current $I_M$ is the required margin for programming all the MRAM cells 105 and the current $I_s$ is the safety margin to insure the programming but not having the positive and negative bidirectional cell currents $+I_C$ and $-I_C$ too large.

The row write programming current $I_R$ 240 has a very loose tolerance above the point a of FIG. 5. The only limitation being the level of the disturb current that is coupled to adjacent word line segments 109a, 109b, . . . , 109m-1, 109m. In MRAM arrays 100 having segmented word lines, the physical length of the word line segments 109a, 109b, . . . , 109m-1, 109m is very short and thus the coupling between the word line segments 109a, 109b, . . . , 109m-1, 109m is very small. However, as the array densities have increased with the improvements of manufacturing technologies, the common nodes 142a and 142b that are connected through the Block Select transistor 135a or 135b to the current source 145 have capacitances that become very large. The charge stored at the common nodes 142a and 142b when the current source 145 is connected through the Block Select transistor 135a or 135b is sufficiently large to program a selected row segment of MRAM cells independent of the current source. Instead of being a constant current, the current is now determined by the capacitance of the common nodes 142a and 142b, the size of the Row Write Select transistors 120a, 120b, . . . , 120m-1, 120m, and the current sink of the reference current return line 150. The MRAM array 100 as applied to this invention employs a current pulse in the programming operation. The common nodes 142a and 142b are precharged for the programming operation by activation of the Block Select transistor 135a or 135b to allow current from the current source 145 to flow to the word line segment 108a, 108b, . . . , 108m-1, 108m or 109a, 109b, . . . , 109m-1, 109m.

Figure 6:
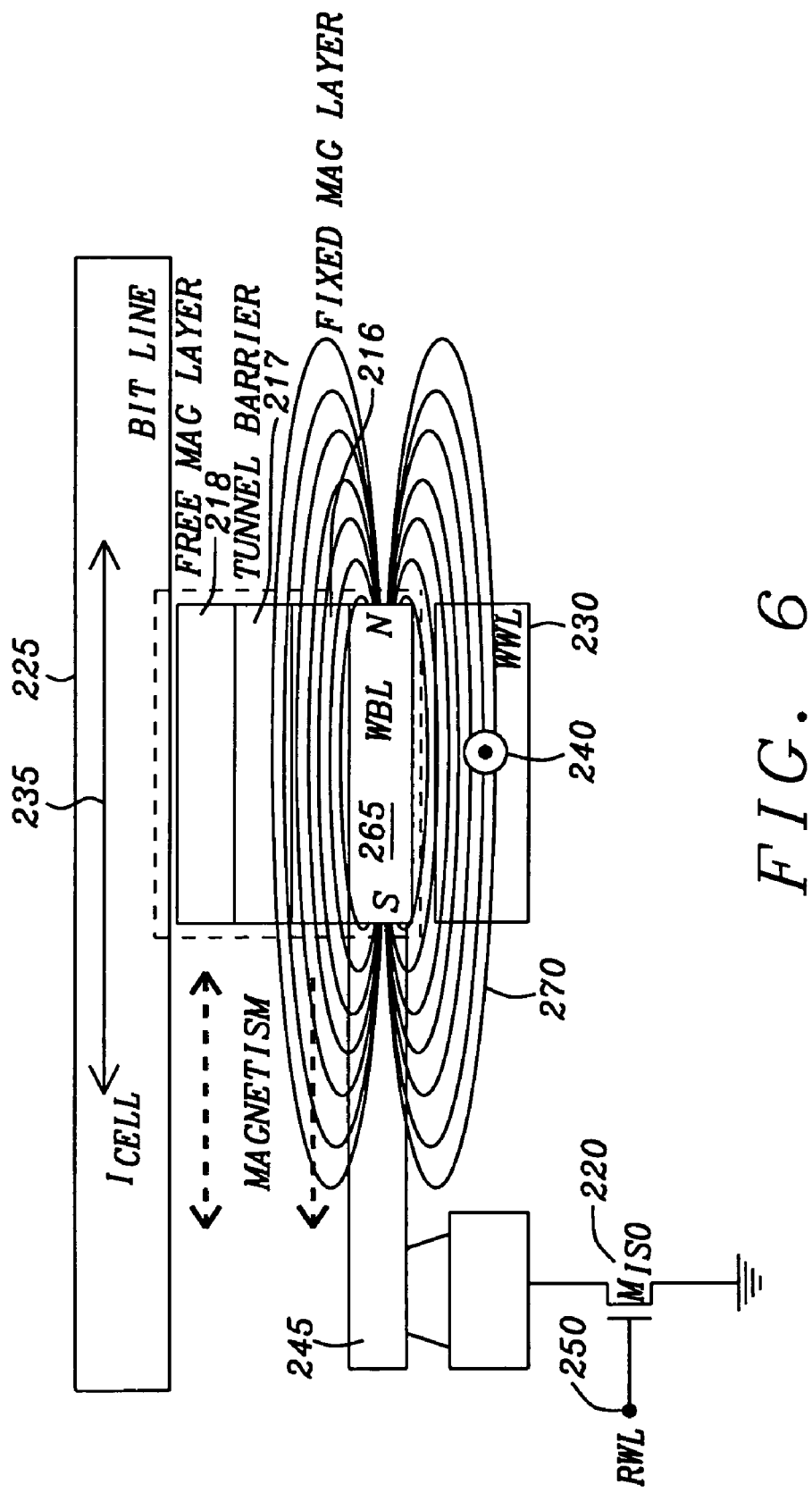
FIG. 6 is a cross sectional diagram of a first embodiment of an MRAM cell of this invention.

To provide a biasing magnetic field for the MTJ device of the selected MRAM cells 105, the biasing current as shown at point a may be directly generated or provided as permanent magnet layer associated with each MTJ device. Refer now to FIG. 6 for a discussion of a first embodiment of the MRAM cell structure where the biasing magnetic field is generated by a biasing current. As described in FIGS. 1a and 1b, the MRAM cell 200 has an MTJ device 215 for retaining digital data as an orientation of the magnetic fields within the MTJ device 215. Each MTJ device 200 is formed of two layers of magnetic material 216 and 218 isolated from each other by a tunnel barrier 217. The free magnetic layer 218 is adjoined to the bit line 225. The bit line 225 conducts the bidirectional cell current $I_c$ 235 such that the magnetic field developed by the bidirectional cell current $I_C$ 235 in the bit line 225 with the row write cell current $I_R$ 240 determines the magnetic orientation of the free magnetic layer 218. The direction of the bidirectional cell current $I_C$ 235 determines the state of digital data within the MTJ device 215. The write word line 230 is magnetically coupled to the free magnetic layer 218 and conducts a row write cell current $I_R$ 240 in one direction. The preferred embodiment of the MRAM cell where the biasing magnetic field for the MTJ device of the selected MRAM cells 105 is provided as permanent magnet layer is shown in FIG. 6. The permanent magnetic layer 265 generates the biasing magnetic field 270. The biasing magnetic field is structured to be equivalent to that generated by the biasing current $I_{BIAS}$ 260 thus allowing the small bidirectional cell current $I_C$ 235 and the write pulse current of the row write current $I_R$ 240. The permanent magnetic layer 265 is a permanent magnet material such as permalloy, nickel iron, cobalt iron, and any other magnetic material capable of generating the permanent magnetic biasing field 270.

Figure 7:
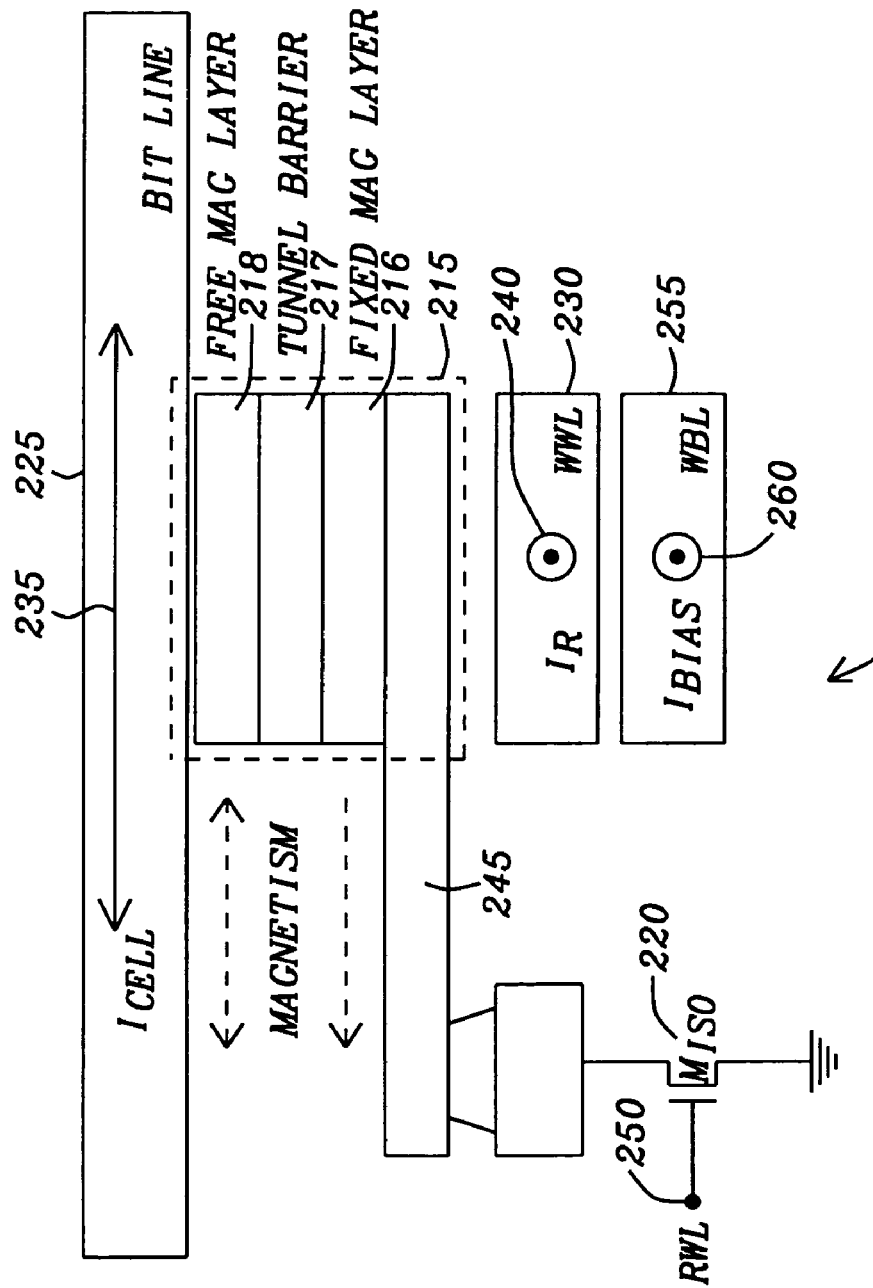
FIG. 7 is a cross sectional diagram of a second embodiment of an MRAM cell of this invention.

A second embodiment of the MRAM cell where the biasing magnetic field for the MTJ device of the selected MRAM cells 105 is provided as permanent magnet layer is shown in FIG. 7. The basic structure of the MRAM cell 200 is as described in FIG. 6 except the permanent magnetic layer 265 is replaced with the write biasing line 255. The biasing current $I_{BIAS}$ 260 is conducted through the write biasing line 255 to generate the biasing magnetic field for the programming of the MTJ device 215 of the MRAM cell 200.

The fixed magnetic layer 216 is adjoined to a conductor 245 that is connected to the drain of an isolation transistor $M_{ISO}$ 220. The source of the isolation transistor $M_{ISO}$ 220 is connected to the ground reference point. The gate of the isolation transistor $M_{ISO}$ 220 is connected to a read word line RWL 250. The combination of the write biasing magnetic field, the magnetic field generated by the bidirectional cell current $I_C$ 235, and the row write cell current $I_R$ 240 are combined to determine the magnetic orientation of the free magnetic layer 218 and thus the digital data state the MTJ cell.

Figure 8:
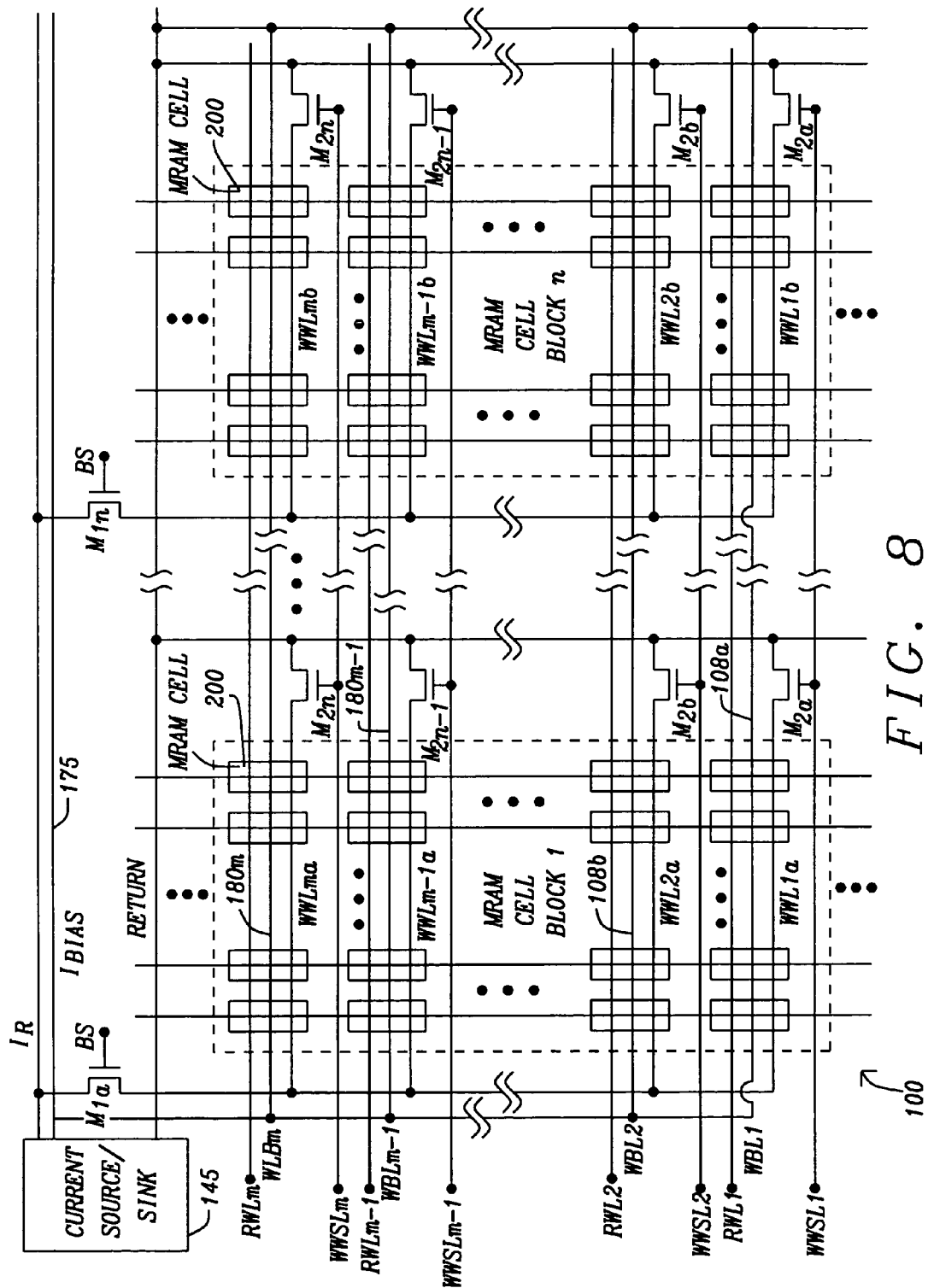
FIG. 8 is a block diagram of a first embodiment of an MRAM array of this invention.

An MRAM array incorporating MRAM cell of FIG. 7 is structurally the same as that shown in FIG. 3. The MRAM cells 105 as described in FIG. 3 are replaced with the MRAM cells 200 of FIG. 7. The permanent magnetic layers 265 of FIG. 7 providing the biasing magnetic field to allow the programming of the MRAM cells of this invention as described hereinafter in FIG. 9. FIG. 8 illustrates an MRAM array incorporating the first embodiment of the MRAM cells of this invention. The MRAM array 100 is structured as the MRAM array of the prior art as illustrated in FIG. 3. The MRAM cells 105 of FIG. 3 are replaced with the MRAM cells 200 of FIG. 6. The fundamental structure is identical to that of the prior art except with the addition of the write bias lines 180a, 180b, . . . , 180m-1, 180m to each row of the array 100 of MRAM cells. The write bias lines are connected to the bias current $I_{BIAS}$ distribution network 175 that is connected to the current source 145. The current source 145 generating the bias current $I_{BIAS}$.

Figure 9:
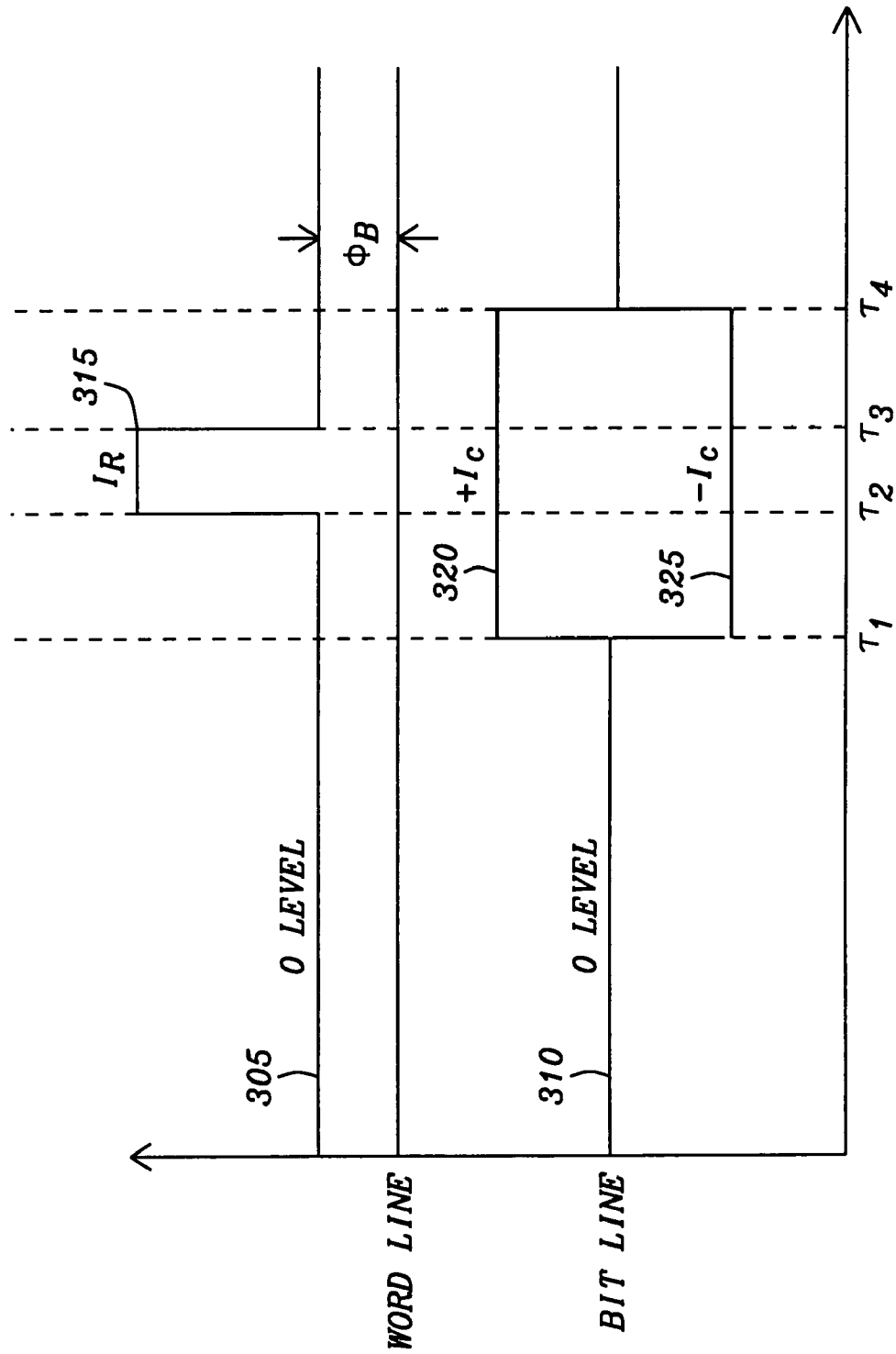
FIG. 9 is a plot of the cell current and word line segment reference current of this invention.

Referring to FIG. 9, the magnetic biasing field Φ300 generated by the biasing current $I_{BIAS}$ 260 of FIG. 6 or the permanent magnetic layer 265 of FIG. 7 provides the biasing offset for the fixed reference write cell current $I_R$ 305. To program an MRAM cell, a positive cell programming current $+I_C$ 320 or a negative cell programming current $-I_C$ 325 is applied to the bit line of a selected column associated with the selected word line segment at the time $\tau_1$. At the time $\tau_2$, the fixed reference write cell current $I_R$ 305 is activated to discharge the selected word line segment. The word line current pulse 315 has an amplitude and duration that is determined by the capacitance of the common nodes of the word line segments, the size of the Row Write Select transistors, and the current sink of the reference current return line. The positive cell programming current $+I_C$ 320 or the negative cell programming current $-I_C$ 325 are terminated at the time $\tau_4$. This unique operating sequence with the bidirectional positive cell programming current $+I_C$ 320 or a negative cell programming current $-I_C$ 325 being turned on followed with a very high word line current pulse 315 and completed with terminating the low bidirectional positive cell programming current $+I_C$ 320 or a negative cell programming current $-I_C$ 325 assures that the free magnetic layer has a predictable magnetic orientation.

Figure 10:
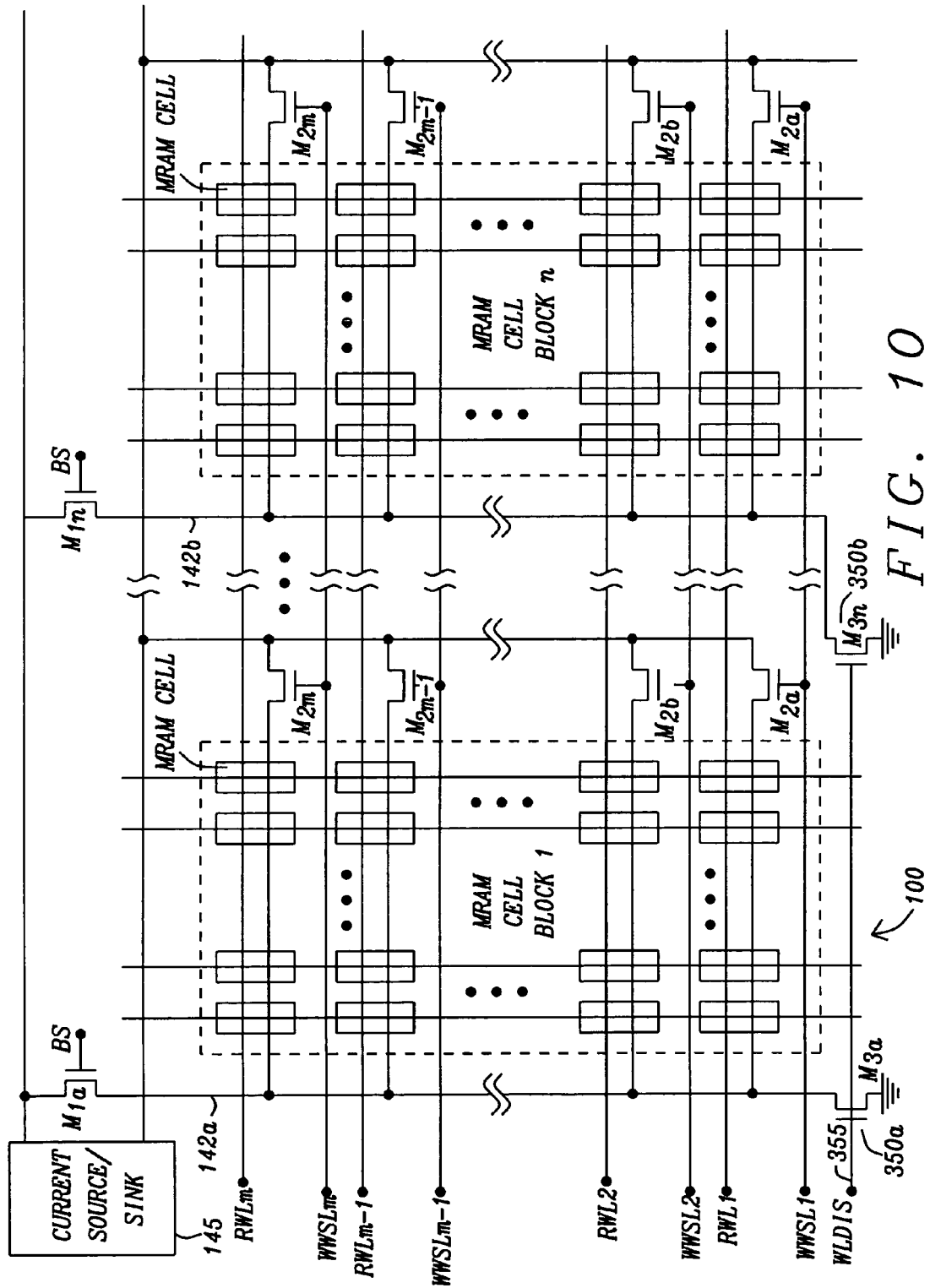
FIG. 10 is a block diagram of a second embodiment of an MRAM array of this invention.

Any residual charge present at the capacitance of the common nodes of the word line segments may cause unintended programming or disturbance of adjacent MRAM cells. To alleviate this problem discharge transistors are connected to the common nodes to discharge the word line segments. Refer now to FIG. 10 for a discussion of an MRAM array 100 with discharge transistors 350a and 350b. The structure of the MRAM array 100 is essentially identical to that of the MRAM array of FIGS. 3 and 8 with the addition of the discharge transistors 350a and 350b.

The drains of the discharge transistors 350a and 350b are connected to the capacitance of the common nodes 142a and 142b. The sources of the discharge transistors 350a and 350b are connected to the ground reference point. Alternately, sources of the discharge transistors 350a and 350b may be connected to provide a return current to the current source/sink 140. The gates of the discharge transistors 350a and 350b are connected to receive a word line segment discharge signal 355. The word line segment discharge signal 355 is activated to turn on a selected discharge transistor 350a or 350b at the completion of the programming of a selected MRAM cell. The size and structure of the discharge transistors 350a and 350b are tailored to minimize the current the discharge current from the common nodes 142a and 142b to prevent any fields developed by the discharge current from disturbing the state of the MRAM cells 105.

Figure 11:
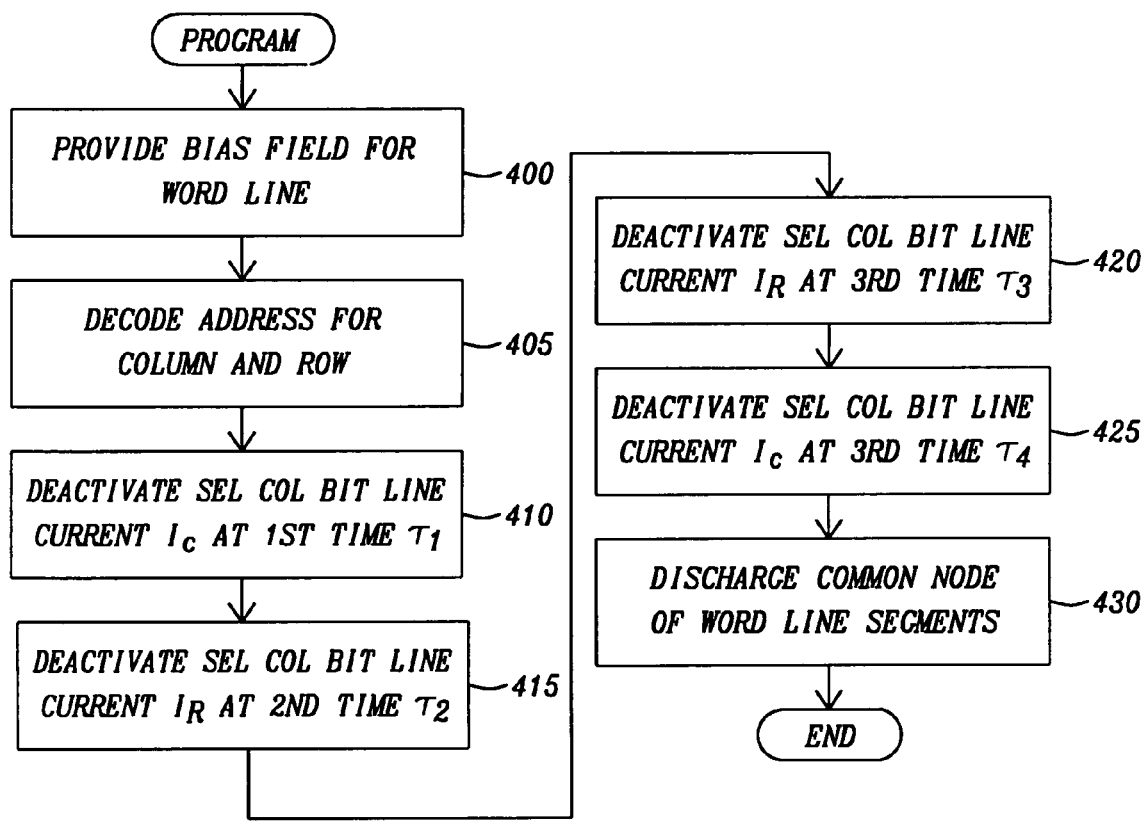
FIG. 11 is flow chart of the method for programming MRAM cells of this invention.

Refer now to FIG. 11 for a summary of the programming of selected MRAM cells on a word line segment. A magnetic biasing field is provided (Box 400) for each MRAM cell. The biasing field may be generated by the permanent magnetic layer 265 of FIG. 6 or the biasing current $I_{BIAS}$ 260 of FIG. 7. An address is decoded (Box 405) for column and row to select the MRAM cells to be programmed. The selected column bit lines are activated (Box 410) with the positive bit line programming current $+I_C$ or a negative bit line programming current $-I_C$ at the time $\tau_1$. The Row Write Select transistors are activated (Box 415) to discharge the common word line segment nodes to generate the word line current pulse $I_R$ at the second time $\tau_2$. The word line current pulse has a duration of from the time $\tau_2$ to the time $\tau_3$ and is deactivated (Box 420). The selected column bit lines are deactivated (Box 425) at the time $\tau_4$. This unique operating sequence assures that the free magnetic layer has a predictable magnetic orientation.

Any residual charge present at the capacitance of the common nodes of the word line segments may cause unintended programming or disturbance of adjacent MRAM cells. To alleviate this problem discharge transistors are activated (Box 430) to discharge the common nodes of the word line segments to a ground reference point.

Figure 12:
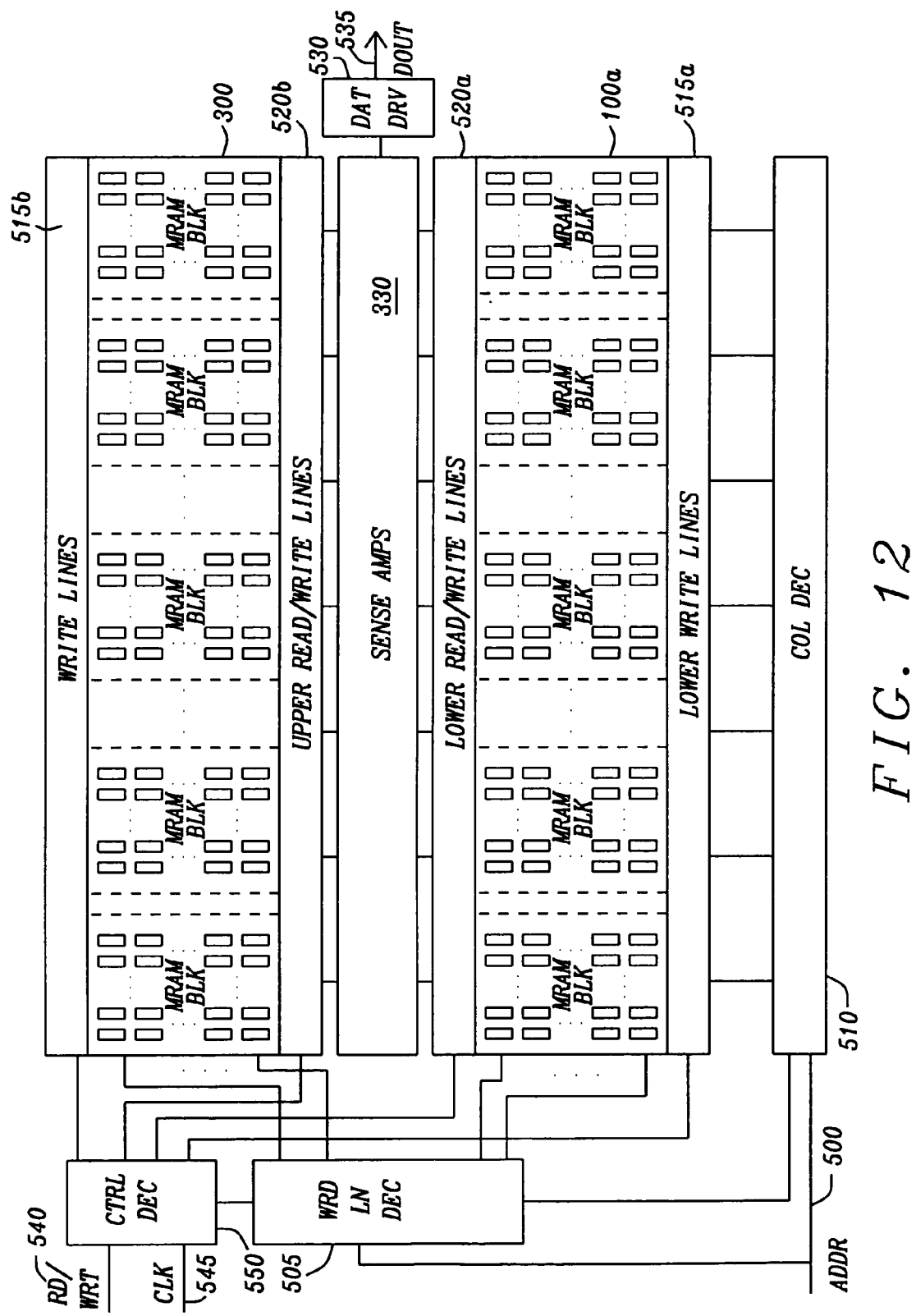
FIG. 12 is a block diagram of an MRAM array of this invention.

An array of the MRAM memory cells having a biasing magnetic field of this invention is shown in FIG. 12. An address 500 is received by the word line decoder 505 and the column or bit line decoder 510 and translated to select the desired MRAM cells for programming or reading. The column decoder 510 is connected through the upper and lower write lines 515a and 515b and upper and lower read/write lines 520a and 520b to the MRAM arrays 100a and 100b. The word line decoder 505 provides the necessary control signals for activating the selected rows of the MRAM arrays 100a and 100b.

The MRAM arrays 100a and 100b are constructed in one embodiment from the MRAM cells of FIG. 6 and in the second embodiment of the MRAM cells of FIG. 7 to provide the magnetic biasing field for each of the MRAM cells of this invention. The word line decoder 505 encompasses the function of current source 130 of FIGS. 3 and 8 to provide the word line programming current or fixed reference write cell current and the biasing current of the first embodiment of the MRAM cell of this invention.

The column decoder 510 provides the positive or negative bidirectional cell current $+I_C$ or $-I_C$ for programming the state of the digital data to the free magnetic layer of the first or second embodiment of the MRAM cell of this invention. The timing of the positive or negative bidirectional cell current $+I_C$ or $-I_C$ and the word line programming current pulse as described in FIG. 9.

The sense amplifiers 525 are connected through the upper and lower read/write lines 520a and 520b to the MRAM arrays 100a and 100b to sense the read current during a read operation. The reading of the MRAM cells of the first and second embodiments of this invention is identical to that described for FIG. 1b. The sensed data signals is transferred from the sense amplifiers 525 to the data driver 530 which amplifies and conditions the sense data for transfer as the output data 535 to external data.

The read/write signals 540 and the clocking signals 545 provide the control signals to the control decoder 550. The control decoder 550 generating the necessary and timing and control signals for the reading and writing of the MRAM arrays 100a and 100b.

While this invention has been particularly shown and described with reference to the preferred embodiments thereof, it will be understood by those skilled in the art that various changes in form and details may be made without departing from the spirit and scope of the invention.

The invention claimed is:

1. An MRAM array comprising:
a plurality of MRAM devices arranged in rows and columns;
a plurality of bit lines, each bit line associated with one column of the columns of the plurality of MRAM devices and adjoined to a free magnetic layer of each MRAM device of said column;
a plurality of word lines, each word line associated with one row of the plurality of MRAM devices and comprising multiple word line segments, said word line segments in close proximity to a fixed magnetic layer of each MRAM device of a sub-grouping of said one row of MRAM devices;
an MRAM programming circuit in communication with each of the plurality of bit lines and each of the multiple word line segments of the plurality of word line, said programming circuit providing a bidirectional bit line current to a selected bit line of the plurality of bit lines and a word line current pulse to one word line segment of one row of word line segments; and
a field biasing device having a magnetic coupling to each of the plurality of MRAM devices to provide a magnetic biasing field to each of the MRAM device.

2. The MRAM array of claim 1 wherein the bidirectional bit line current is activated at a first time, said word line current pulse is activated to have a duration from a second time to a third time, and said bidirectional bit line current is deactivated at a fourth time.

3. The MRAM array of claim 1 wherein said magnetic biasing field has a magnetic orientation equivalent to the magnetic orientation of a word line segment magnetic field generated by said word line current pulse.

4. The MRAM array of claim 1 further comprising a plurality of word line segment transistors coupled between each of said multiple word line segments of said plurality of word lines and a word line current return path, such that when one of said word line segment transistors is turned on said word line current pulse passed through said word line segment transistor to said word line current return path.

5. The MRAM array of claim 1 wherein said word line current pulse is generated by discharging groupings of said word line segments coupled together to said MRAM programming circuit.

6. The MRAM array of claim 5 wherein said programming circuit charges said word line segments for discharging to provide said word line current pulse.

7. The MRAM array of claim 6 wherein said programming circuit includes block select transistors connected to each of said word line segments for charging said word line segments.

8. The MRAM array of claim 1 wherein the field biasing device comprises a plurality of permanent magnetic layers, each permanent magnetic layers placed in proximity to said fixed magnetic layer of each of said MRAM devices to provide said magnetic biasing field.

9. The MRAM array of claim 1 wherein the field biasing device comprises a plurality of write biasing lines, each write biasing line in close proximity to each fixed magnetic layer of each MRAM device of one row of the MRAM devices, essentially parallel to the word line segments of said word line associated with said row of MRAM devices.

10. A method for programming an MRAM array comprising the steps of:
providing said MRAM array, said MRAM array comprising
a plurality of MRAM devices arranged in rows and columns;
a plurality of bit lines, each bit line associated with one column of the columns of the plurality of MRAM devices and adjoined to a free magnetic layer of each MRAM device of said column;
a plurality of word lines, each word line associated with one row of the plurality of MRAM devices and comprising multiple word line segments, said word line segments in close proximity to a fixed magnetic layer of each MRAM device of a sub-grouping of said one row of MRAM devices;
providing a bidirectional bit line current to a selected bit line of the plurality of bit lines; and
providing a word line current pulse to one word line segment of one row of word line segments; and
providing a magnetic biasing field to each of the plurality of MRAM devices.

11. The method for programming said MRAM array of claim 10 wherein providing said bidirectional bit line current and providing a word line current pulse comprises the steps of:
activating said bidirectional bit line current at a first time;
activating said word line current pulse to have a duration from a second time to a third time; and
deactivating said bidirectional bit line current at a fourth time.

12. The method for programming said MRAM array of claim 10 further comprising the step of:
orienting said magnetic biasing field to a magnetic orientation equivalent to the magnetic orientation of a word line segment magnetic field generated by said word line current pulse.

13. The method for programming said MRAM array of claim 10 wherein providing a word line current pulse comprises the steps of:
providing a plurality of word line segment transistors coupled between each of said multiple word line segments of said plurality of word lines and a word line current return path; and
turning on one of said word line segment transistors so that said word line current pulse is passed through said word line segment transistor to said word line current return path.

14. The method for programming said MRAM array of claim 10 wherein providing a word line current pulse comprises the steps of:
discharging groupings of said word line segments coupled together to said MRAM programming circuit.

15. The method for programming said MRAM array of claim 14 further comprising the step of charging said word line segments to provide said word line current pulse.

16. The method for programming said MRAM array of claim 10 wherein providing said magnetic biasing field comprises the step of:
providing a field biasing device said field biasing device comprising a plurality of permanent magnetic layers, each permanent magnetic layers placed in proximity to said fixed magnetic layer of each of said MRAM devices to provide said magnetic biasing field.

17. The method for programming said MRAM array of claim 10 wherein providing said magnetic biasing field comprises the step of:
providing a field biasing device comprising a plurality of write biasing lines, each write biasing line in close proximity to each fixed magnetic layer of each MRAM device of one row of the MRAM devices, essentially parallel to the word line segments of said word line associated with said row of MRAM devices.

18. An apparatus for programming an MRAM array comprising the steps of:
means for providing said MRAM array, said MRAM array comprising
a plurality of MRAM devices arranged in rows and columns;
a plurality of bit lines, each bit line associated with one column of the columns of the plurality of MRAM devices and adjoined to a free magnetic layer of each MRAM device of said column;
a plurality of word lines, each word line associated with one row of the plurality of MRAM devices and comprising multiple word line segments, said word line segments in close proximity to a fixed magnetic layer of each MRAM device of a sub-grouping of said one row of MRAM devices;
means for providing a bidirectional bit line current to a selected bit line of the plurality of bit lines;
means for providing a word line current pulse to one word line segment of one row of word line segments; and
means for providing a magnetic biasing field to each of the plurality of MRAM devices.

19. The apparatus for programming said MRAM array of claim 18 wherein means for providing said bidirectional bit line current and means for providing a word line current pulse comprises:
means for activating said bidirectional bit line current at a first time;
means for activating said word line current pulse to have a duration from a second time to a third time; and
means for deactivating said bidirectional bit line current at a fourth time.

20. The apparatus for programming said MRAM array of claim 18 further comprising:
means for orienting said magnetic biasing field to a magnetic orientation equivalent to the magnetic orientation of a word line segment magnetic field generated by said word line current pulse.

21. The apparatus for programming said MRAM array of claim 18 wherein means for providing a word line current pulse comprises:
means for providing a plurality of word line segment transistors coupled between each of said multiple word line segments of said plurality of word lines and a word line current return path; and
means for turning on one of said word line segment transistors so that said word line current pulse is passed through said word line segment transistor to said word line current return path.

22. The apparatus for programming said MRAM array of claim 18 wherein means for providing a word line current pulse comprises:
means for discharging groupings of said word line segments coupled together to said MRAM programming circuit.

23. The apparatus for programming said MRAM array of claim 22 further comprising means for charging said word line segments to provide said word line current pulse.

24. The apparatus for programming said MRAM array of claim 18 wherein means for providing said magnetic biasing field comprises:
means for providing a field biasing device said field biasing device comprising a plurality of permanent magnetic layers, each permanent magnetic layers placed in proximity to said fixed magnetic layer of each of said MRAM devices to provide said magnetic biasing field.

25. The apparatus for programming said MRAM array of claim 18 wherein means for providing said magnetic biasing field comprises:
means for providing a field biasing device comprising a plurality of write biasing lines, each write biasing line in close proximity to each fixed magnetic layer of each MRAM device of one row of the MRAM devices, essentially parallel to the word line segments of said word line associated with said row of MRAM devices.

* * * * *